United States Patent [19]

Ohsawa et al.

[11] 4,167,649
[45] Sep. 11, 1979

[54] CURRENT MIRROR CIRCUIT AND APPARATUS FOR USING SAME

[75] Inventors: Mitsuo Ohsawa, Fujisawa; Hiroshi Nakazawa, Kawagoe; Hiroshi Yamagishi, Tokyo, all of Japan

[73] Assignee: Sony Corporation, Tokyo, Japan

[21] Appl. No.: 827,381

[22] Filed: Aug. 24, 1977

[30] Foreign Application Priority Data

Aug. 24, 1976 [JP] Japan .................. 51-101019

[51] Int. Cl.$^2$ .................................................. H04R 5/04
[52] U.S. Cl. .................................. 179/1 GE; 307/270; 307/315
[58] Field of Search .................. 179/15 BT, 1 GE; 307/52, 270, 315

[56] References Cited

U.S. PATENT DOCUMENTS

| | | | |
|---|---|---|---|
| 3,233,125 | 2/1966 | Buie | 307/315 |
| 3,246,210 | 4/1966 | Lorenz | 307/315 |
| 3,281,639 | 10/1966 | Potter et al. | 307/315 |
| 3,843,933 | 10/1974 | Ahmed | 330/291 |
| 3,887,879 | 6/1975 | Radovsky | 330/257 |
| 4,049,918 | 9/1977 | Ohsawa | 179/15 BT |

*Primary Examiner*—Douglas W. Olms
*Attorney, Agent, or Firm*—Lewis H. Eslinger; Alvin Sinderbrand

[57] ABSTRACT

A current mirror circuit comprised of three transistor devices, each transistor device including an input terminal and first and second output terminals. Two of the devices have their input terminals connected together and one output terminal of each device is connected to a respective current output terminal. The other output terminal of each device is adapted to be supplied with an operating voltage. Each of the first and second transistor devices is formed of at least a pair of transistors connected in Darlington-type configuration. In one embodiment, these Darlington-connected transistors are of complementary types. The third transistor device has its input terminal coupled to one of the current output terminals and one of its output terminals coupled to the common-connected input terminals of the first and second transistor devices. The remaining output terminal of the third transistor device is coupled to a reference potential. The third transistor device also is formed of at least a pair of transistors connected in Darlington-type configuration. In one embodiment, a current feedback resistor is connected to one output terminal of each of the first and second transistor devices. In another embodiment, each of the first and second transistor devices includes one transistor whose base is supplied with current by another transistor, this base being coupled to the current output terminal by a bias resistor.

21 Claims, 17 Drawing Figures

Fig. 11
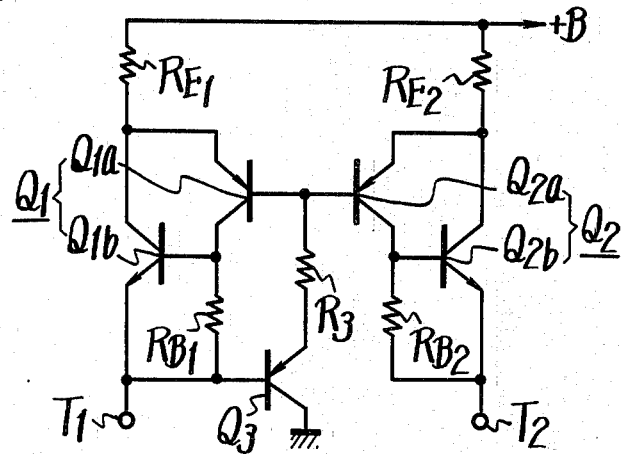
Fig. 12
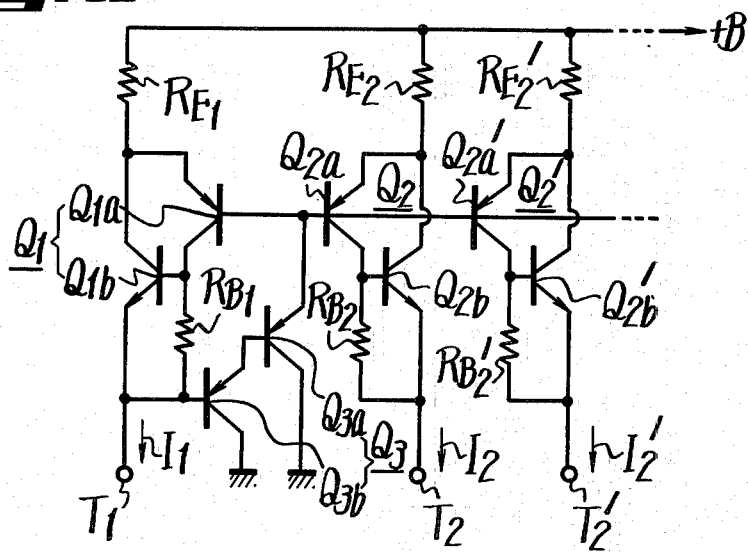
Fig. 14
Fig. 17
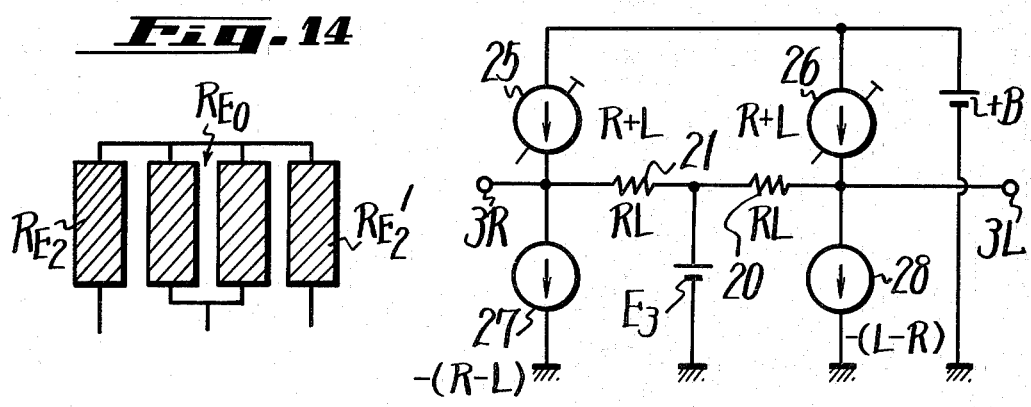

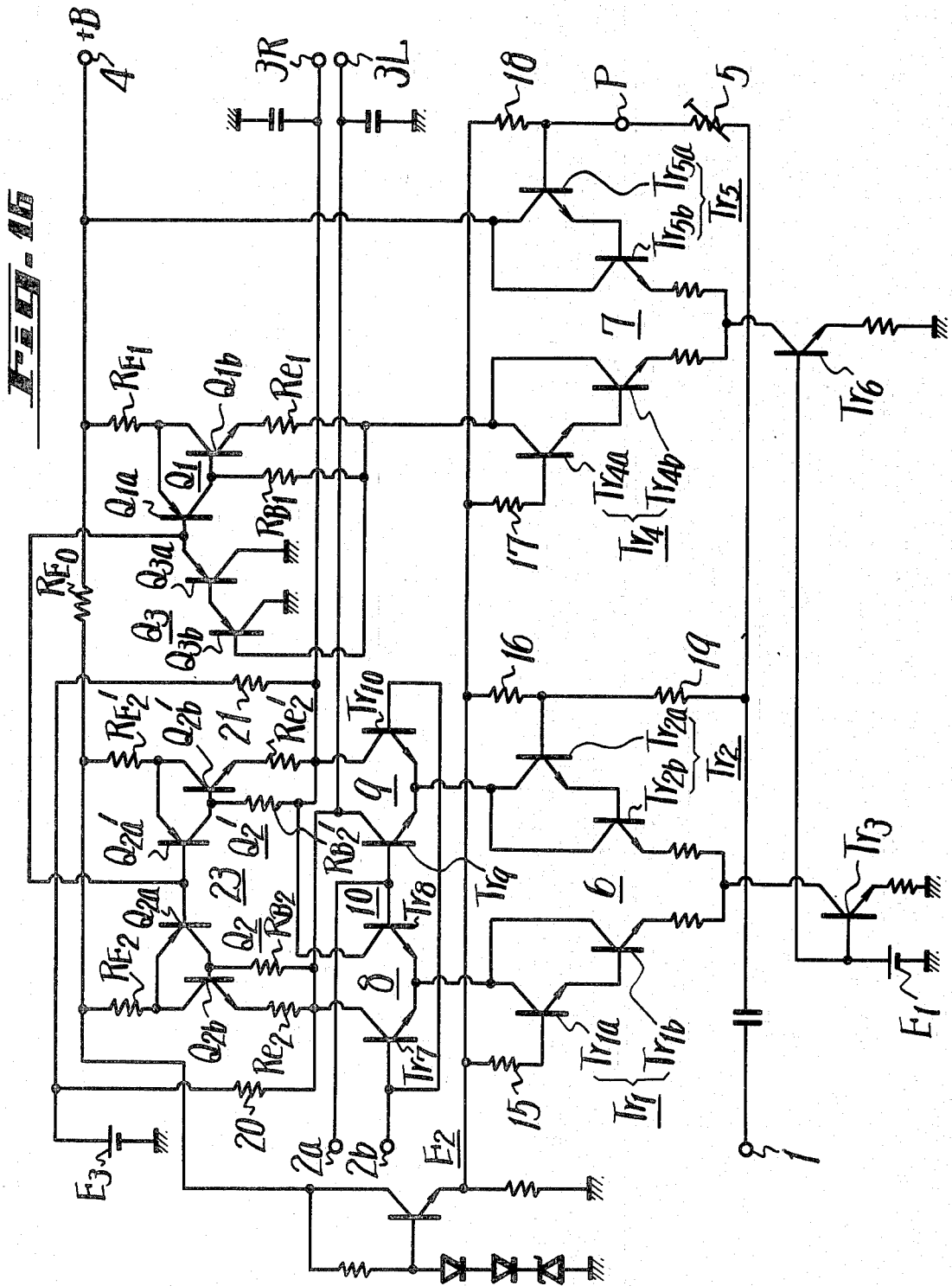

CURRENT MIRROR CIRCUIT AND APPARATUS FOR USING SAME

BACKGROUND OF THE INVENTION

This invention relates to a current mirror circuit and, more particularly, to an improved current mirror circuit wherein current supplied to one output terminal is substantially identical to the current which is supplied to another output terminal; and to an application for such an improved current mirror circuit.

The so-called current mirror circuit is a device generally formed of at least two stages, or circuits which, ideally, have identical currents flowing therethrough. In the current mirror circuit, changes in one current are reflected by identical changes in the other current. Thus, if one current is determined by other devices, such as an amplifier, the level of the other current is a generally accurate measure of the first current.

The current mirror circuit is a useful device for providing a current which is to be measured or used in additional apparatus but where the source of that current would be deleteriously affected or otherwise influenced if the measuring circuits or other apparatus were to be coupled to the current source. One example of such a use is in a demodulator for a composite stereo signal comprised of a main channel (L+R) signal and a sub-channel (L−R) signal modulated onto a subcarrier, which stereo signal is to be demodulated into left (L) and right (R) channel signals. One type of stereo demodulator includes an amplifier for recovering the main channel (L+R) signal and a switching circuit for recovering the oppositely phased versions of the sub-channel signal, with the main channel signal being added to both phases of the sub-channel signal. If the recovered main channel signal is added directly to the recovered sub-channel signal, it is possible that the load on the main channel amplifier would affect the recovered main channel signal level. Hence, the quality of the derived left (L) and right (R) audio channel signals would be degraded. However, the use of a current mirror circuit would avoid this problem. Thus, in the current mirror circuit, one stage thereof could be coupled to the main channel amplifier such that a current proportional to the main channel signal flows therethrough, while second and third stages could be coupled to the switching circuit so that currents which also are proportional to the main channel signal flow therethrough. The currents of the second and third stages can be added to the recovered oppositely-phased sub-channel signals without presenting a load either to the main channel amplifier or to the switching circuit. Hence, the derived left and right channel audio signals are of greater fidelity.

The foregoing is but one application of a current mirror circuit; and various other applications and uses of the current mirror circuit are known. However, some disadvantages attend current mirror circuits which have been proposed heretofore. As one example of such a current mirror cricuit, each of the two stages is formed of a simple transistor whose base electrodes are connected in common. The collector electrode of one transistor is coupled to its base electrode, and both transistors have substantially the same current amplification factors and other characteristics. While the current through the emitter-collector circuit of one transistor is almost the same as the current through the emitter-collector circuit of the other transistor, the ratio between such currents is determined, in part, by the transistor amplification factor. As this current amplification factor increases, the ratio between the two currents approaches unity. However, since there is an upper limit to the value of the current amplification factor, there also is an upper limit to the approach of this current ratio to unity.

In one modification of this proposed current mirror circuit, the collector-base connection is effected through the emitter-base circuit of another transistor, the collector electrode of which is connected to a reference potential. The ratio between the currents flowing through the first and second transistors now is proportional to the product of the current amplification factor of either of these transistors and the current amplification factor of the third transistor. While the current ratio more closely approaches unity in this modified proposal, there still is a practical upper limit thereon which, in many instances and applications is not acceptable. That is, even in this improved proposal, changes in the current flowing through one transistor are not reflected entirely in the current flowing through the other transistor.

OBJECTS OF THE INVENTION

Therefore, it is an object of the present invention to provide an improved current mirror circuit for producing output currents which are substantially identical.

Another object of this invention is to provide a current mirror circuit formed of at least two stages wherein the ratio between the currents flowing through such stages more closely approaches unity than in current mirror circuits which have been proposed heretofore.

A further object of this invention is to provide a current mirror circuit having improved linearity, a low distortion factor and a wide dynamic range.

An additional object of this invention is to provide an improved current mirror circuit having a high signal-to-noise (S/N) ratio.

Yet another object of this invention is to provide a current mirror circuit which exhibits stable operating characteristics.

A still further object of this invention is to provide a current mirror circuit having a very small range of differences between the output currents supplied thereby; and wherein current feedback resistors are used, but the effects of differences between such resistors also are reduced.

Another object of this invention is to provide a current mirror circuit formed of transistor stages and wherein differences in the current amplification factors and base-emitter voltages of the transistors in such stages are compensated.

A further object of this invention is to provide a current mirror circuit for stereo signal applications and, in particular, for use with a stereo demodulator which exhibits good separation characteristics with respect to the derived output signals and which prevents hum and noise from being mixed into the derived output signals.

Various other objects, advantages and features of the present invention will become readily apparent from the ensuing detailed description, and the novel features will be particularly pointed out in the appended claims.

SUMMARY OF THE INVENTION

In accordance with this invention, a current mirror circuit is provided with at least first, second and third transistor devices, each device having an input terminal and first and second output terminals, and each device being formed of at least a pair of transistors connected in Darlington-type configuration. The input terminal of first and second transistor devices is connected in common. One of the output terminals of the third transistor device is coupled to the common-connected input terminals of the first and second transistor devices, and first and second current output terminals are coupled to one of the output terminals of the first and second transistor devices, respectively. An operating voltage is adapted to be supplied to the other output terminal of each of the first and second transistor devices, and the input terminal of the third transistor device is coupled to the first current output terminal, while the other output terminal of the third transistor device is coupled to a reference potential.

In one application thereof, the current mirror circuit is provided with a fourth transistor device which is connected to a third current output terminal and whose input terminal is coupled in common to the input terminal of the second transistor device. A stereo demodulator circuit, which is adapted to demodulate main channel (L+R) and sub-channel (L−R) signals, is provided with a main channel amplifier whose output terminal is coupled to the first current output terminal, thereby establishing a first current proportional to the main channel signal. The stereo demodulator circuit also includes a switching circuit having two output terminals for producing oppositely phased sub-channel signals, these two output terminals being coupled to the second and third output terminals of the current mirror circuit. The respective currents flowing to the second and third current output terminals each is proportional to the main channel signal and is added to the demodulated sub-channel signals, thereby recovering the respective left (L) and right (R) channel audio signals.

BRIEF DESCRIPTION OF THE DRAWINGS

The following detailed description, given by way of example, will best be understood in conjunction with the accompanying drawings in which:

FIG. 11 is a schematic diagram of another embodiment of the present invention;

FIG. 12 is a schematic diagram of yet another embodiment of the present invention;

FIG. 14 represents how a portion of the circuit schematically shown in FIG. 13 is constructed in accordance with integrated circuit fabrication techniques;

FIG. 16 is a schematic diagram of one application of the present invention; and

FIG. 17 is an equivalent circuit representation of the schematic illustration shown in FIG. 16.

DETAILED DESCRIPTION OF CERTAIN OF THE PREFERRED EMBODIMENTS

Figure 1:
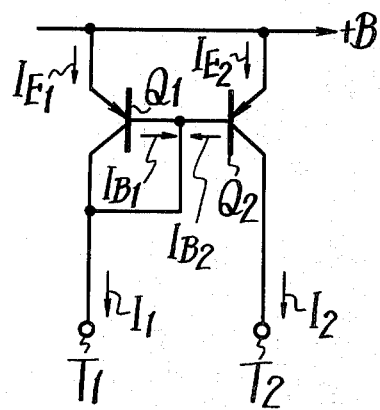
FIG. 1 is a schematic diagram of one proposal for a current mirror circuit.

The improved operating characteristics which are achieved by the present invention can best be appreciated by comparing such characteristics to those of previously suggested proposals. FIG. 1 is a schematic diagram of one such proposal for a current mirror circuit, and is comprised of PNP transistor stages constituted by transistors $Q_1$ and $Q_2$ whose emitter electrodes are connected to a source of operating voltage +B and whose base electrodes are connected in common. Current output terminals $T_1$ and $T_2$ are connected to the collector electrodes of the respective transistors, and the collector electrode of transistor $Q_1$ is connected to its base electrode such that this transistor is connected in diode configuration.

Since the base-emitter voltages of transistors $Q_1$ and $Q_2$ are equal, then the base current $I_{B2}$ of transistor $Q_2$ is equal to the base current $I_{B1}$ of transistor $Q_1$ ($I_{B2}=I_{B1}$). Now, output current $I_1$ applied to current output terminal $T_1$ is equal to the sum of the emitter current $I_{E1}$ of transistor $Q_1$ plus the base current of transistor $Q_2$:

$$I_1 = I_{E1} + I_{B2} \tag{1}$$

If the common emitter current amplification factor is represented as $h_{FE}$, and if the current amplification factor of transistor $Q_1$ is equal to the current amplification factor of transistor $Q_2$, then base current $I_{B2}$ may be expressed as:

$$I_{B2} = \frac{1}{1 + h_{FE1}} I_{E2} \tag{2}$$

Now, if the current $I_2$ supplied to current output $T_2$ is equal to the emitter current of transistor $Q_2$ minus its base current, then current $I_2$ may be represented as:

$$I_2 = \frac{h_{FE1}}{1 + h_{FE1}} I_{E2} \tag{3}$$

It has been assumed that the operating characteristics of transistor $Q_1$ are equal to the operating characteristics of transistor $Q_2$. Thus, the respective emitter currents are equal. The ratio of output current $I_2$ to output current $I_1$ is obtained by dividing equation (3) by equation (1), resulting in:

$$I_2/I_1 = \frac{1}{1 + \frac{2}{h_{FE1}}} \quad (4)$$

In an ideal current mirror circuit, output current $I_2$ should be identical to output current $I_1$. That is, the ratio of $I_2/I_1$ ideally should be unity. As is apparent from equation (4), the ratio of $I_2/I_1$ approaches unity as the current amplification factor $h_{FE1}$ increases. However, since there is upper limit to the value of $h_{FE1}$, there also is an upper limit to the approach of $I_2/I_1$ to unity.

Figure 2:
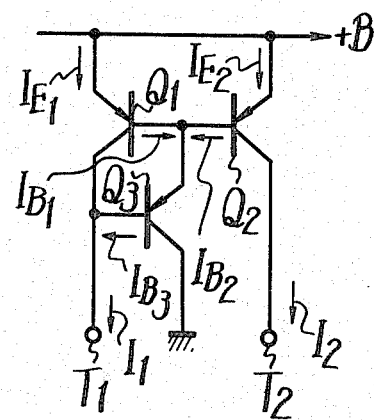
FIG. 2 is a schematic diagram of another proposal for a current mirror circuit.

In view of this drawback, that is, the difficulty in achieving a current ratio $I_2/I_1$ which is equal to unity, it has been suggested that the base-collector connection of transistor $Q_1$ be made through the base-emitter circuit of an additional transistor, such as transistor $Q_3$ shown in FIG. 2. The collector electrode of transistor $Q_3$ is connected to a reference potential, such as ground.

If the base current of transistor $Q_3$ is represented as $I_{B3}$, and if the common-emitter current amplification factor of transistor $Q_3$ is represented as $h_{FE2}$, then output current $I_1$ may be expressed as:

$$I_1 = \frac{h_{FE1}}{1 + h_{FE1}} I_{E1} + I_{B3} \quad (5)$$

The emitter current of transistor $Q_3$ is equal to the sum of the base currents of transistors $Q_1$ and $Q_2$. Since the base current $I_{B3}$ is proportional to the emitter current by the factor $1/1+H_{FE2}$, then:

$$I_{B3} = \frac{1}{1 + h_{FE2}} (I_{B1} + I_{B2}) \quad (6)$$

$$= \frac{1}{1 + h_{FE2}} \cdot \frac{1}{1 + h_{FE1}} (I_{E1} + I_{E2}) \quad (6a)$$

Output current $I_2$ may be expressed as set out in equation (3) above, and which is rewritten here as:

$$I_2 = \frac{h_{FE1}}{1 + h_{FE1}} I_{E2} \quad (7)$$

Transistors $Q_1$ and $Q_2$ again exhibit the same operating charateristics such that their emitter currents are equal. Accordingly, the ratio of output currents $I_2/I_1$ may be expressed as:

$$I_2/I_1 = \frac{1}{1 + \frac{2}{(1 + h_{FE2})h_{FE1}}} \quad (8)$$

It is appreciated that the output current ratio in equation (8) more closely approaches unity than the output current ratio of equation (4). As one example of the construction of the current mirror circuit shown in FIG. 2, this circuit may be formed as a monolithic semiconductor integrated circuit wherein transistors $Q_1$ and $Q_2$ are lateral transistors and transistor $Q_3$ is a vertical transistor. This construction may be selected because of its ease of fabrication. Accordingly, the current amplification $h_{FE1}$ of a lateral transistor typically is about five and the current amplification factor $h_{FE2}$ of a vertical transistor typically is about forty. When these values are used in equation (8), output current ratio $I_2/I_1$ is approximately 0.99. Nevertheless, in many applications using current mirror circuits, this output current ratio is unacceptable because it does not approximate unity sufficiently.

Figure 3:
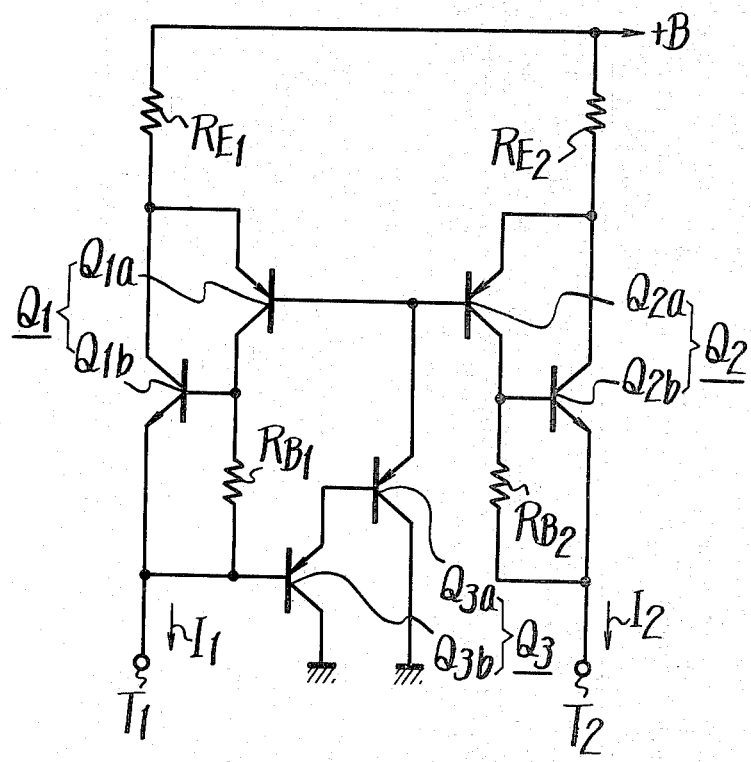
FIG. 3 is a schematic diagram of one embodiment of a current mirror circuit in accordance with the present invention.

One embodiment of a current mirror circuit in accordance with the present invention which achieves a closer approximation of unity for the output current ratio is schematically illustrated in FIG. 3. This current mirror circuit preferably is formed as a monolithic semiconductor integrated circuit formed of transistor devices $Q_1$, $Q_2$ and $Q_3$, each such transistor device including an input terminal and first and second output terminals. Transistor devices $Q_1$ and $Q_2$ are constructed with substantially equal operating characteristics, and each transistor device is comprised of individual transistors connected in Darlington-type configuration. More particularly, transistor device $Q_1$ is formed of a pair of complementary transistors $Q_{1a}$ and $Q_{Q1b}$ connected such that the transistor device exhibits PNP-type characteristics. Thus, transistors $Q_{1a}$ is a PNP transistor and $Q_{1b}$ is an NPN transistor, the collector electrode of transistor $Q_{1b}$ being connected to the emitter electrode of transistor $Q_{1a}$, the collector electrode of transistor $Q_{1a}$ being connected to the base electrode of transistor $Q_{1b}$ and the emitter electrode of transistor $Q_{1b}$ being connected to current output terminal $T_1$. The base electrode of transistor $Q_{1a}$ functions as the input terminal of transistor device $Q_1$.

Transistor device $Q_2$ is comprised of complementary transistors $Q_{2a}$ and $Q_{2b}$ which are connected in a manner similar to the connections of the individual transistors comprising transistor device $Q_1$. In addition, the base electrodes of transistors $Q_{1a}$ and $Q_{2a}$ are connected in common. The Darlington-type configuration of transistor devices $Q_1$ and $Q_2$ also is sometimes known as a common-emitter-common-collector circuit.

One output terminal of each of transistor devices $Q_1$ and $Q_2$, i.e., the emitter electrodes of transistors $Q_{1a}$ and $Q_{2a}$, are coupled via respective current feedback resistors $R_{E1}$ and $R_{E2}$ to a source of operating voltage +B. As will be appreciated, these current feedback resistors are of equal resistance value.

Transistor device $Q_3$ also is comprised of a pair of transistors connected in Darlington-type configuration and having an input terminal and first and second output terminals. More particularly, transistors $Q_{3a}$ and $Q_{3b}$ both are PNP transistors with the base electrode of transistor $Q_{3a}$ being connected to the emitter electrode of transistor $Q_{3b}$. The emitter electrode of transistor $Q_{3a}$ is connected as one output terminal of transistor device $Q_3$ to the common-connected base electrodes of transistors $Q_{1a}$ and $Q_{2a}$. The base electrode of transistor $Q_{3b}$ is connected as the input terminal of transistor $Q_3$ to current output terminal $T_1$. The collector electrodes of transistors $Q_{3a}$ and $Q_{3b}$ are connected in common as the other output terminal of transistor device $Q_3$ to a reference potential, such as ground.

Figure 4:
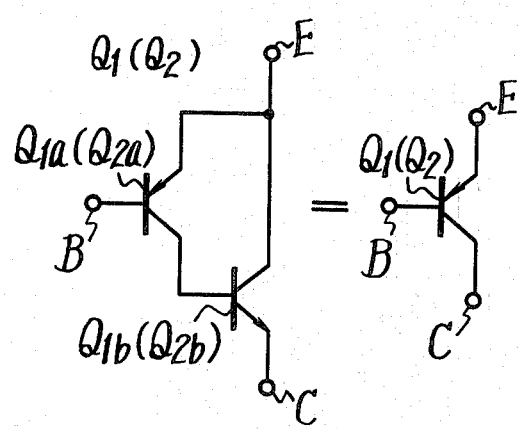
FIG. 4 is a schematic representation of one of the transistor devices used in the embodiment shown in FIG. 3.
Figure 5:
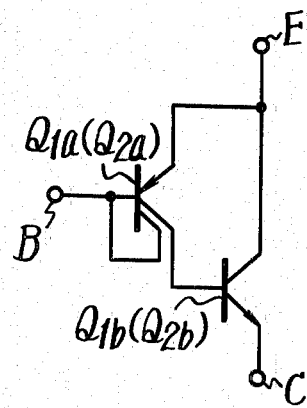
FIG. 5 is a schematic representation of another embodiment of one of the transistor devices which can be used with the present invention.
Figure 8:
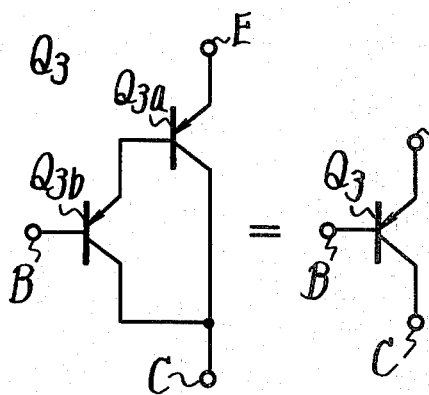
FIG. 8 is a schematic representation of an embodiment of another transistor device which can be used with the present invention.

Each of transistor devices $Q_1$ and $Q_2$ may be considered as a PNP transistor, such as schematically represented in FIG. 4. As an alternative, transistor $Q_{1a}$ (and also transistor $Q_{2a}$) may include multiple collectors wherein one such collector is connected to the base electrode thereof. This configuration is schematically depicted in FIG. 5. Also, the overall operating characteristics of transistor device $Q_3$ are similar to that of a PNP transistor, and this transistor device may be considered as a PNP transistor, such as schematically depicted in FIG. 8.

Because of the connection of transistor device $Q_3$ between the input terminal of transistor device $Q_1$ and current output terminal $T_1$, the bias voltage between these terminals, that is, between the base electrode of transistor $Q_{1a}$ and the emitter electrode of transistor $Q_{1b}$, is greater than the base-emitter voltage $V_{be}$ of NPN transistor $Q_{1b}$. More particularly, this bias voltage is at least equal to $2V_{be}$.

Preferably, base resistors $R_{B1}$ and $R_{B2}$ are connected between the base and emitter electrodes of transistors $Q_{1b}$ and $Q_{2b}$; and, more particularly, each such base resistor is connected between the base electrode of its respective NPN transistor and a current output terminal.

Figure 6:
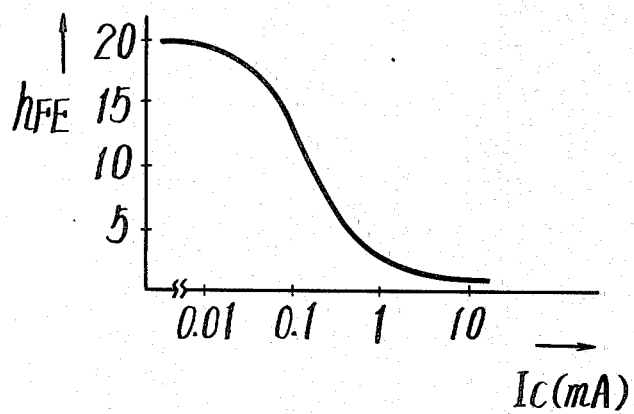
FIG. 6 is a graphical representation of operating characteristics of one of the transistors used in the transistor device in accordance with one embodiment of the present invention.
Figure 7:
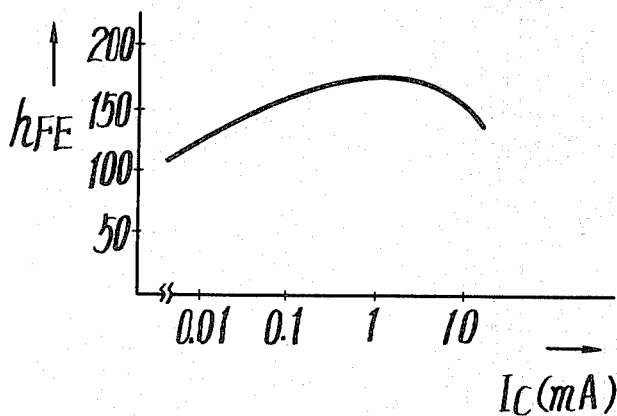
FIG. 7 is a graphical representation of the operating characteristics of another of the transistors used in the transistor device of one embodiment of the present invention.

Let it be assumed that PNP transistors $Q_{1a}$ and $Q_{2a}$ are lateral transistors. The current amplification factor $h_{FE}$ of such a lateral transistor varies with the collector current thereof in the manner represented in FIG. 6. Let it be further assumed that transistors $Q_{1b}$ and $Q_{2b}$ each are vertical transistors having a current amplification factor $h_{FE}$ which varies with collector current in the manner represented by the graph of FIG. 7. In one practical use of the current mirror circuit shown in FIG. 3, the collector current of each NPN transistor is about 1 mA. Thus, as shown in FIG. 7, the current amplification factor $h_{FE}$ is about 175. Accordingly, its base current is approximately $1/175 = 0.0057$ mA. Since the base current of transistor $Q_{1b}$ is substantially equal to the collector current of transistor $Q_{1a}$, it is appreciated that the collector current of transistor $Q_{1a}$ also is approximately 0.0057 mA. Hence, the current amplification factor of transistor $Q_{1a}$ is about 20, as seen from FIG. 6. Thus, the overall current amplification factor of transistor device $Q_1$ (as well as that of transistor device $Q_2$) is substantially equal to the product of the current amplification factors of respective transistors $Q_{1a}$ and $Q_{1b}$. That is, the overall current amplification factor of transistor device $Q_1$ is approximately $175 \times 20 = 3500$. Thus, it is appreciated that the current amplification factor of transistor device $Q_1$, as shown in FIG. 3, is much greater than the current amplification factor of current mirror circuits of the type which have been proposed heretofore, such as shown in FIGS. 1 and 2.

With respect to transistor device $Q_3$, a typical current amplification factor for each of the PNP transistors comprising this transistor device is about 40. Accordingly, the overall current amplification factor $h_{FE2}$ of transistor device $Q_3$ is equal to the product of the current amplification factors of each of transistors $Q_{3a}$ and $Q_{3b}$. Thus, $h_{FE2}$ is equal to $40 \times 40 = 1600$.

If transistor devices $Q_1$, $Q_2$ and $Q_3$ of the embodiment shown in FIG. 3 are compared to transistors $Q_1$, $Q_2$ and $Q_3$ of FIG. 2, the output current ratio $I_2/I_1$ for the FIG. 3 embodiment can be represented by equation (8). Thus, for the current mirror circuit shown in FIG. 3, this output current ratio is:

$$I_2/I_1 = \frac{1}{1 + \frac{2}{1601 \times 3500}} = \frac{1}{1.0000003} \approx 0.9999997$$

The output current ratio of the current mirror circuit shown in FIG. 3 is a substantial improvement over that of the current mirror circuit shown in FIG. 2 because it more closely approaches unity. Thus, if output current $I_1$ through transistor device $Q_1$ is established, output current $I_2$ through transistor device $Q_2$ approaches the theoretical ideal of being identical to output current $I_1$.

Because of the Darlington-type configuration of transistors $Q_{3a}$ and $Q_{3b}$, the bias voltage applied between the base electrode of transistor $Q_{1a}$ and emitter electrode of transistor $Q_{1b}$ is at least $2V_{be}$ which, of course, is greater than the mere base-emitter voltage of transistor $Q_{1b}$. If the current from the base electrode of transistor $Q_{1a}$ to the emitter electrode of transistor $Q_{1b}$ remains the same, the increase in the bias voltage between these electrodes may be considered to be an increase in the impedance of transistor device $Q_1$, which means that the current amplification factor $h_{FE}$ of this transistor is relatively high. Consequently, the aforementioned current amplification factor of 3500 can be obtained, and transistor devices $Q_1$ and $Q_2$ have improved linearity, a low distortion factor and a wide dynamic range.

Figure 9:
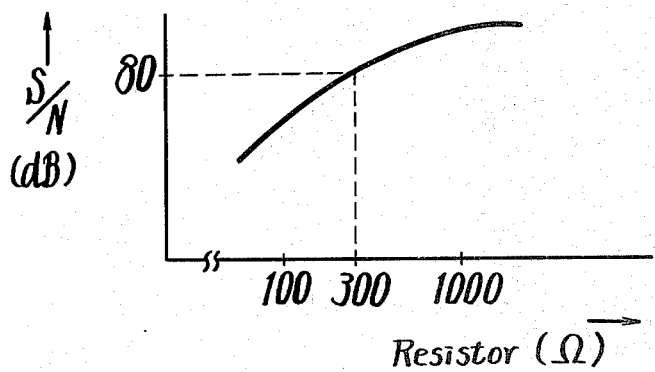
FIG. 9 is a graphical representation showing improved signal-to-noise characteristics which can be achieved by the present invention.

One problem with lateral junction transistors, such as lateral junction PNP transistors $Q_{1a}$ and $Q_{2a}$, is that the low current amplification factor $h_{FE}$ thereof makes these transistors susceptible to noise. The signal-to-noise (S/N) ratio is increased by connecting emitter resistors $R_{E1}$ and $R_{E2}$ to the emitter electrodes of these lateral junction PNP transistors. These resistors, which function as current feedback resistors, serve to apply negative feedback to the emitters of transistors $Q_{1a}$ and $Q_{2a}$, respectively, so as to result in a high S/N ratio. A graphical representation of the relationship between these current feedback resistors and the S/N ratio is shown in FIG. 9 which indicates that as the resistance of these current feedback resistors increases, the corresponding S/N ratio likewise increases. In practice, the resistance value for each of current feedback resistors $R_{E1}$ and $R_{E2}$ preferably is in the range of between 100 and 500 ohms. As can be seen from FIG. 9, in one specific embodiment, if the current feedback resistance is selected to be 300 ohms, the S/N ratio is about 80 dB.

The use of base bias resistors $R_{B1}$ and $R_{B2}$ for transistors $Q_{1b}$ and $Q_{2b}$, respectively, offers some advantages. To best appreciate these advantages, let it be assumed that these bias resistors are omitted. Let it be further assumed that suitable loads (not shown) are coupled to current output terminals $T_1$ and $T_2$. Now, if the voltage provided at current output terminal $T_1$ increases so as to increase the emitter voltage of transistor $Q_{1b}$, this transistor becomes less conductive. Hence, the collector current of transistor $Q_{1b}$ decreases, with the result that the collector current of transistor $Q_{2b}$ likewise decreases. In the absence of bias resistors $R_{B1}$ and $R_{B2}$, a decrease in the collector current of transistors $Q_{1b}$ and $Q_{2b}$ is accompanied by a decrease in the current amplification factor, thereby reducing the collector currents of transistors $Q_{1a}$ and $Q_{2a}$, respectively. A reduction in the collector currents of transistors $Q_{1a}$ and $Q_{2a}$ is accompanied by a reduction in the respective current amplification factors thereof. Since the overall operating characteristics of transistor device $Q_1$ (and also transistor device $Q_2$) are similar to that of a PNP transistor, a reduction in the effective collector current of this PNP transistor increases the impedance from the base electrode of transistor $Q_{1a}$ to the emitter electrode of transistor $Q_{1b}$. A similar increase in the impedance is obtained between the base electrode of transistor $Q_{2a}$ and the emitter electrode of transistor $Q_{2b}$. This tends to make transistor devices $Q_1$ and $Q_2$ unstable. Stated otherwise, if the base and emitter resistances of transistor $Q_{1b}$ are assumed to be $R'_b$ and $R'_e$, respectively, then the input impedance of transistor $Q_{1b}$ may be expressed as $R'_b + h_{FE}(R'_e + R_L)$ wherein $h_{FE}$ is the current amplification factor of this transistor and $R_L$ is the load impedance (not shown) coupled to current output terminal T₁. As mentioned previously, the collector current of transistor $Q_{1b}$ had been assumed to decrease because of an increase in the voltage applied to current output terminal T₁. This increase in the voltage may be attributed to a substantial increase in the load impedance $R_L$. Thus, the input impedance of transistor $Q_{1b}$ is seen to increase. A similar explanation is applicable to the increase in the input impedance of transistor $Q_{2b}$.

As mentioned previously, the current mirror circuit shown in FIG. 3 preferably is formed as an integrated circuit. Accordingly, the inherent capacitive coupling in the integrated circuit cooperates with the increase in the input impedance of transistor $Q_{1b}$ (and also the increase in the impedance of transistor device $Q_1$) such that oscillation may occur. This highly unstable condition is, of course, undesirable.

However, if bias resistor $R_{B1}$ is connected as shown, the collector current of transistor $Q_{1a}$ now has a current conducting path through this bias resistor. Hence, although an increase in the voltage at current output terminal T₁ tends to reduce the collector current of transistor $Q_{1b}$, the collector current of transistor $Q_{1a}$ can flow through bias resistor $R_{B1}$ and, therefore, need not be reduced. Rather, if the collector current of transistor $Q_{1b}$ decreases, the collector current of transistor $Q_{1a}$ may increase so as to maintain a substantially constant current through transistor device $Q_1$. This increase in the collector current of transistor $Q_{1a}$ results in an increase in the base-emitter voltage of transistor $Q_{1b}$ because of a corresponding increase in the voltage drop across resistor $R_{B1}$. This increase in the base-emitter voltage of transistor $Q_{1b}$ tends to restore its collector current to the proper value. Stated otherwise, the provision of base bias resistor $R_{B1}$ reduces the input impedance of transistor $Q_{1b}$, thereby decreasing the tendency of the transistor device to oscillate in the manner described above.

Accordingly, if the collector currents of transistors $Q_{1a}$ and $Q_{1b}$ are maintained at relatively higher levels, the current amplification factor $h_{FE}$ of transistor device $Q_1$ is maintained at its higher value. Thus, the output current ratio $I_2/I_1$ maintains its very close approximation to unity. Therefore, the illustrated current mirror circuit remains stable.

The foregoing discussion of transistor device $Q_1$ is applicable also to transistor device $Q_2$. Thus, by providing bias resistor $R_{B2}$, the overall current amplification factor $h_{FE}$ of transistor device $Q_2$ is maintained relatively high, the imput impedance of transistor $Q_{2b}$ is prevented from becoming too great so as to cause oscillation, and the overall operating characteristics of transistor device $Q_2$ remain stable.

Figure 10:
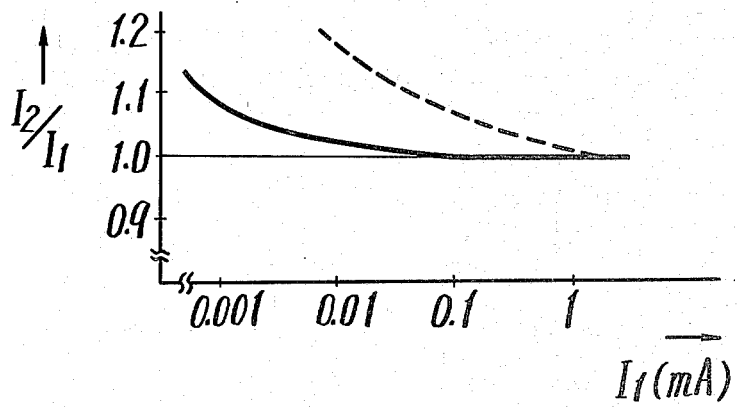
FIG. 10 is a graphical representation showing how the present invention achieves improved operating characteristics.

A comparison between the approach of the output ratio $I_2/I_1$ to unity when bias resistors $R_{B1}$ and $R_{B2}$ are used and when such bias resistors are omitted is depicted in FIG. 10 wherein the solid curve corresponds to the use of such resistors and the broken curve corresponds to the omission thereof. In particular, the ordinate of the graphical representation represents the output current ratio and the abscissa represents one of the output currents, such as current $I_1$ which, in some applications, is established by additional apparatus coupled to current output terminal T₁. The resistance value of each of bias resistors $R_{B1}$ and $R_{B2}$, for which the solid curve has been drawn, is about 7.5 kilohms. However, these resistors need not be limited solely to this resistance value but, rather, may have a resistance in the range between 1 and 10 kilohms, and particularly between 6 and 8 kilohms. As depicted in the graphical representation of FIG. 10, as output current $I_1$ increases, the output current ratio more closely approximates unity. The graphical representation also indicates that the current mirror circuit is more stable when bias resistors $R_{B1}$ and $R_{B2}$ (the solid curve) are provided.

Another embodiment of the current mirror circuit in accordance with the present invention is schematically illustrated in FIG. 11. The FIG. 11 embodiment is similar to the embodiment shown and described with reference to FIG. 3, and like component parts are identified by the same reference numerals. Transistor device $Q_3$ preferably is of the type shown in FIG. 8, and the effective emitter electrode thereof is coupled via a resistor $R_3$ to the common-connected base electrodes of transistors $Q_{1a}$ and $Q_{2a}$. This addition of resistor $R_3$ provides an additional voltage across the base electrode of transistor $Q_{1a}$ and the emitter electrode of transistor $Q_{1b}$ such that this voltage is greater than $2V_{be}$, the voltage present in the embodiment of FIG. 3. Hence, the current mirror circuit shown in FIG. 11 is, advantageously, even more stablei.

Turning now to the embodiment shown in FIG. 12, there is a further modification of the current mirror circuit described previously with respect to FIG. 3. The reference numerals used in FIG. 3 also are used in FIG. 12 to identify like elements. In FIG. 12, at least one additional transistor device $Q'_2$ is provided. This additional transistor device is substantially similar to aforedescribed transistor device $Q_2$, and the elements constituting transistor device $Q'_2$ are identified by the same reference numerals which are used to identify the elements of transistor device $Q_2$, with the addition of a prime ('). As shown, an additional current output terminal $T'_2$ is coupled to one of the output terminals of additional transistor device $Q'_2$ for supplying an output current $I'_2$. The operating characteristics of additional transistor device $Q'_2$ are equal to the operating characteristics of transistor devices $Q_1$ and $Q_2$. Furthermore, current feedback resistor $R'_{E2}$ has the same resistance value as that of current feedback resistor $R_{E2}$, which may be on the order of 200 ohms. Bias resistor $R'_{B2}$ has the same resistance value as that of bias resistors $R_{B1}$ and $R_{B2}$, which is on the order of 8 kilohms. Thus, output currents $I_1$, $I_2$ and $I'_2$ all are substantially equal to each other, the output current ratios $I_2/I_1$ and $I'_2/I_1$ being close approximations of unity.

Figure 13:
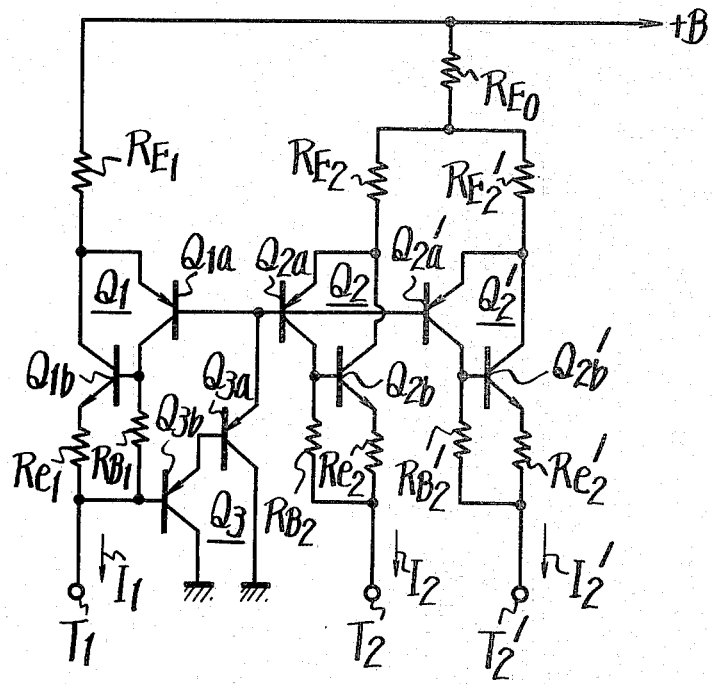
FIG. 13 is a schematic diagram of a still further embodiment of the present invention.

Yet another embodiment of the current mirror circuit in accordance with the present invention is shown schematically in FIG. 13 wherein like reference numerals are used to identify the same elements which have been discussed previously with respect to FIG. 12. The embodiment of FIG. 13 differs from that of FIG. 12 in that a common resistor $R_{Eo}$ is used to connect current feedback resistors $R_{E2}$ and $R'_{E2}$ to source of operating voltage $+B$. Although the combination of current feedback resistors $R_{E2}$, $R'_{E2}$ and $R_{Eo}$ is equivalent to the combination of current feedback resistors $R_{E2}$ and $R'_{E2}$ of FIG. 12, the configuration shown in FIG. 13 may be advantageous for integrated circuit construction. This is because the resistance values of current feedback resistors, even when formed as an integrated circuit, may not be identical to each other but, rather, may be within a broad range of, for example, $\pm 5$ to $\pm 6\%$. Because of this relatively wide range of variation in the resistance values the respective output currents $I_1$, $I_2$ and $I'_2$ likewise may exhibit a wide range of variation. However, by using a common resistor $R_{Eo}$, the range of variation of output currents $I_2$ and $I'_2$ may be reduced. This is because common resistor $R_{Eo}$ will conduct both output currents. If the resistance value $r_{Eo}$ of resistor $R_{Eo}$ is increased while the resistance values $r_{E2}$ and $r'_{E2}$ of resistors $R_{E2}$ and $R'_{E2}$, are reduced, then the range of variation between currents $I_2$ and $I'_2$ likewise is reduced. That is, if resistance $r_{Eo}$ is much greater than resistance $r_{E2}$ or resistance $r'_{E2}$, current $I_2$ will be almost identical to current $I'_2$. However, if resistance $r_{Eo}$ is too great, then crosstalk interference between currents $I_2$ and $I'_2$ may occur. That is, if such a large common resistor is used, current $I_2$ which flows to the load connected to current output terminal $T_2$ will include a component proportional to current $I'_2$. Likewise, current $I'_2$ which flows to the load connected to current output terminal $T'_2$ will include a component proportional to current $I_2$. Therefore, to minimize this crosstalk interference, it is preferred that resistance values $r_{Eo}$, $r_{E2}$ and $r'_{E2}$ are related such that $2r_{Eo} = r_{E2} = r'_{E2}$.

Consistent with this resistance relationship, the resistance $r_{E1}$ of resistor $R_{E1}$ should be $r_{E1} = 2r_{Eo} + r_{E2} = 2r_{Eo} + r'_{E2}$. If resistance $r_{E2}$ is on the order of 200 ohms, as described previously with respect to FIG. 12, then resistance $r_{Eo}$ is on the order of 100 ohms. Hence, in the embodiment shown in FIG. 13, resistance $r_{E1}$ is on the order of 400 ohms. With these values, the S/N ratio will be sufficiently high, and a graphical representation between the S/N ratio and resistance $r_{E1}$ for the embodiment of FIG. 13 will be substantially similar to the graphical representation shown in FIG. 9, which represents the S/N characteristic for the embodiment shown in FIG. 3.

Although resistance $r_{E1}$ is on the order of 400 ohms, this resistance value desirably may be within the range of from 100 to 500 ohms.

Since resistance values $2r_{Eo} = r_{E2} = r'_{E2}$, the formation of resistors $R_{Eo}$, $R_{e2}$ and $R'_{E2}$ in an integrated circuit may be as shown in FIG. 14. That is, four semiconductor resistive bodies are provided, all having the same resistance value. Two of these semiconductor resistive bodies are electrically connected in parallel. If adjacent bodies are not spaced far from each other, the range of variation of the respective resistance values will be quite limited. This tends to reduce differences between currents $I_2$ and $I'_2$ even further.

In the embodiment of FIG. 13, transistors $Q_{1b}$, $Q_{2b}$ and $Q'_{2b}$ are provided with emitter resistors $R_{e1}$, $R_{e2}$ and $R'_{e2}$, respectively. In one example, the resistance values of each of these emitter resistors is on the order of 100 ohms. The overall voltage gain of, for example, transistor device $Q_1$ is approximately $R_{E1}/R_{e1}$. A similar voltage gain is established for transistor devices $Q_2$ and $Q'_2$. Accordingly, even if the current amplification factors $h_{FE}$ and the base-emitter voltages $V_{be}$ of the respective transistor devices may vary from one to the other, this voltage gain tends to reduce the effect of such variations. Thus, differences in the current amplification factors and base-emitter voltage are compensated. Furthermore, this tends to stabilize each of the transistor devices, especially in the event that a capacitive load is connected to a current output terminal. Possible oscillations due to such a capacitive load are substantially avoided.

Figure 15:
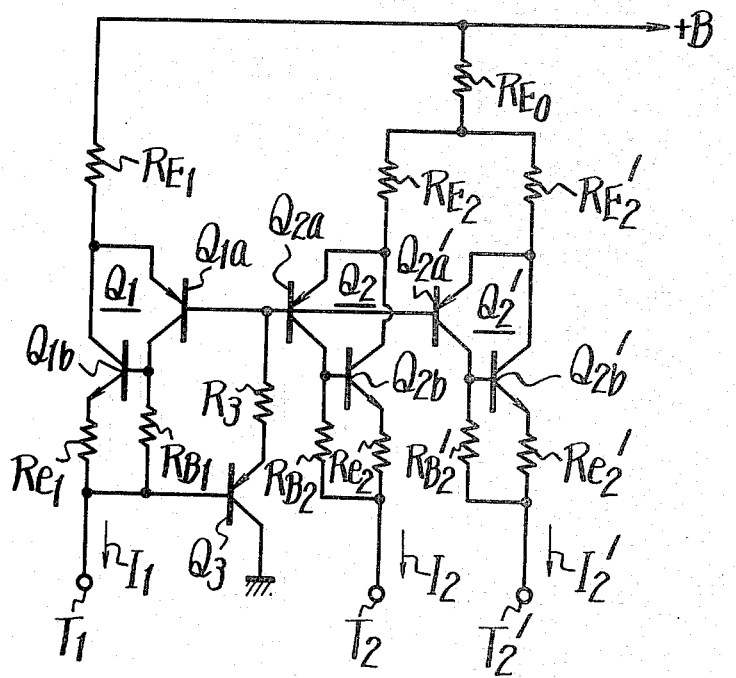
FIG. 15 is a schematic diagram of an additional embodiment of the present invention.

The embodiment shown in FIG. 13 can be further modified by providing resistor $R_3$ between the common-connected base electrodes of transistors $Q_{1a}$ and $Q_{2a}$ and the effective emitter terminal of transistor device $Q_3$. That is, when the embodiment of FIG. 13 is modified in a manner similar to the aforedescribed modification of FIG. 11, the resultant current mirror circuit is as shown in FIG. 15. As may be appreciated, additional transistor devices, similar to transistor devices $Q_2$ and $Q'_2$, may be provided, the input terminals of such additional transistor devices being connected in common to the input terminals of transistor devices $Q_2$ and $Q'_2$. If desired, the output terminals of such additional transistor devices may be connected through respective current feedback resistors to common resistor $R_{Eo}$. In some applications, integrated circuit techniques may be used to form sets of circuits, each set being comprised of transistor devices $Q_2$, $Q'_2$, ..., all connected in the manner shown in FIG. 15, with connecting terminals provided such that plural sets may be interconnected, thereby forming a current mirror circuit having a multiple of current output terminals.

One example of apparatus with which the current mirror circuit of the present invention finds useful application is a stereo demodulating circuit which may be constructed as shown in FIG. 16. The current mirror circuit shown in FIG. 16 is identified by reference numeral 23 and is substantially identical to the embodiment shown in FIG. 13. Hence, in the interest of brevity, further description of this current mirror circuit 23 need not be provided.

The stereo demodulator circuit is adapted to receive a composite stereo signal comprised of a main channel (L+R) signal and a sub-channel (L−R) signal which is modulated onto a subcarrier. Typically, the frequency of the subcarrier is 38 kHz. The information represented by the composite stereo signal is audio information having left (L) and right (R) audio channels. The purpose of the stereo demodulator circuit is to process the main channel and sub-channel signals so as to recover left and right audio signals therefrom. To this effect, the illustrated stereo demodulator circuit includes amplifiers 6 and 7 and a multiplier circuit 10, the latter being coupled to amplifier 6 and, additionally, to current mirror circuit 23.

In particular, amplifier 6 is a differential amplifier formed of differentially-connected transistor devices $T_{r1}$ and $T_{r2}$, each transistor device being formed of transistors $T_{r1a}$, $T_{r1b}$ and $T_{r2a}$, $T_{r2b}$, respectively, connected in Darlington-type configuration. The effective emitter electrodes of the differentially-connected transistor devices are coupled to a constant current source formed of transistor $T_{r3}$ whose base electrode is supplied with a bias voltage represented as voltage supply $E_1$. The effective collector electrodes of transistor devices $T_{r1}$ and $T_{r2}$ serve as the respective output terminals of differential amplifier 6. The input terminal to this differential amplifier is the effective base electrode of transistor device $T_{r2}$, and this input terminal is coupled to an input terminal 1 via a bias resistor 19. Input terminal 1 is adapted to receive the composite stereo signal. A constant voltage circuit, designated generally by reference numeral $E_2$, is adapted to produce a substantially constant bias voltage which is applied to the input terminal of differential amplifier 6 via a resistor 16. This bias voltage also is supplied to the effective base electrode of transistor device $T_{r1}$ by a resistor 15. Preferably, resistors 15 and 16 have equal resistance values.

Multiplier circuit 10 is comprised of differential amplifiers 8 and 9, differential amplifier 8 being formed of differentially-connected transistors $T_{r7}$ and $T_{r8}$; and differential amplifier 9 being formed of differentially-connected transistors $T_{r9}$ and $T_{r10}$. The differentially-connected transistors of differential amplifier 8 have their common-connected emitter electrodes connected to one output terminal of differential amplifier 6, and the differentially-connected transistors of differential amplifier 9 have their common-connected emitter electrodes connected to the other output terminal of differential amplifier 6. In addition, the base electrodes of transistors $T_{r7}$ and $T_{r8}$ are connected in common with the base electrodes of transistors $T_{r10}$ and $T_{r9}$, respectively, to input terminals $2_b$ and $2_a$. These input terminals are adapted to receive a switching signal having a frequency equal to the 38 kHz frequency of the subcarrier for the sub-channel stereo signal. The collector electrodes of transistors $T_{r7}$ and $T_{r9}$ are connected in common through a load resistor 20 to a voltage source $E_3$. These common-connected collector electrodes also are connected to current output terminal $T_2$ which is coupled to one of the output terminals of transistor device $Q_2$ in current mirror circuit 23. As will be explained, this forms a summing junction which is connected to stereo demodulator output terminal 3L. Similarly, the collector electrodes of transistors $T_{r8}$ and $T_{r10}$ are connected in common through a load resistor 21 to voltage source $E_3$ and, additionally, to current output terminal $T'_2$ which is coupled to an output terminal of transistor device $Q'_2$ of current mirror circuit 23. This also forms a summing junction which is coupled to stereo demodulator output terminal 3R.

Amplifier 7 is a differential amplifier which is of similar construction as differential amplifier 6. Accordingly, amplifier 7 is formed of differentially-connected transistor devices $T_{r4}$ and $T_{r5}$ whose effective emitter electrodes are coupled to a constant current source transistor $T_{r6}$, the latter being supplied with a bias voltage from bias voltage source $E_1$. Transistor device $T_{r4}$ is comprised of transistors $T_{r4a}$ and $T_{r4b}$ connected in Darlington-type configuration. Similarly, transistor device $T_{r5}$ is formed of transistor $T_{r5a}$ and transistor $T_{r5b}$ which are connected in Darlington-type configuration. The effective base electrode of transistor device $T_{r5}$ comprises the input terminal of amplifier 7, this input terminal being coupled through a variable resistor 5 to input terminal 1. The purpose of variable resistor 5 is to adjust the level of the composite stereo signal applied to amplifier 7, this adjustment being effective to control the audio channel separation, as will be explained below. The effective base electrodes of transistor devices $T_{r4}$ and $T_{r5}$ are adapted to receive substantially equal bias voltages which are applied thereto via resistors 17 and 18 from bias voltage source $E_2$. Preferably, the resistances of resistors 17 and 18 are equal to each other and, also, to the resistances of resistors 15 and 16. The effective collector electrode of transistor device $T_{r4}$ serves as the output of amplifier 7, this output terminal being connected to current output terminal $T_1$ which is coupled to an output terminal of transistor device $Q_1$ of current mirror circuit 23. The effective collector electrode of transistor device $T_{r5}$ is connected directly to the source of operating voltage $+B$ which is applied to terminal 4.

In operation, the composite stereo signal is applied to input terminal 1 and, via resistors 5 and 19, to amplifiers 7 and 6, respectively. For the purpose of this discussion, amplifier 7 may be considered to be the main channel amplifier and amplifier 6 may be considered to be the sub-channel amplifier. The signal applied to the output terminal of amplifier 7 is the amplified composite stereo signal. As will soon become apparent, the amplified sub-channel signal which is modulated onto the 38 kHz subcarrier can be omitted from further consideration with respect to the output of amplifier 7. Hence, only the amplified main channel (L+R) signal need be considered. Therefore, the current flowing through amplifier 7 is proportional to this main channel (L+R) signal. Consequently, the current flowing through transistor device $Q_1$ to current output terminal $T_1$ and then through amplifier 7 also is proportional to the main channel (L+R) signal. Depending upon the adjustment to variable resistor 5, the level of the composite stereo signal which is supplied as the input signal to amplifier 7 is correspondingly varied. Thus, the level of current $I_1$, which is proportional to the main channel (L+R) signal can be adjusted by suitably adjusting variable resistor 5.

Amplifier 6 also functions to amplify both the main channel (L+R) and the sub-channel (L−R) signals included in the composite stereo signal which is supplied thereto. Now, the 38 kHz switching signal which is applied to terminals $2_a$ and $2_b$ is supplied as a balanced input signal to differential amplifiers 8 and 9. As is known, the combination of differential amplifiers 8 and 9, to which a balanced switching signal is applied, and differential amplifier 6 constitutes a switching circuit for producing oppositely phased sub-channel signals at the output terminals of differential amplifiers 8 and 9. The main channel (L+R) signal which is amplified by amplifier 6 effectively is suppressed by this switching circuit. Thus, the junction defined by the common connection of the collector electrodes of transistors $T_{r7}$ and $T_{r9}$ produces the sub-channel (L−R) signal; while the junction defined by the common connection of the collector electrodes of transistors $T_{r8}$ and $T_{r10}$ produces the oppositely phased (R−L) sub-channel signal.

From the foregoing descriptions of the various embodiments of the current mirror circuit in accordance with the present invention, it now is appreciated that current $I_2$ which flows through transistor device $Q_2$ to current output terminal $T_2$ and output current $I'_2$ which flows through transistor device $Q'_2$ to current output terminal $T'_2$ each is substantially identical to output current $I_1$ which flows through transistor device $Q_1$ to current output terminal $T_1$. Since current $I_1$ is proportional to the main channel (L+R) signal, currents $I_2$ and $I'_2$ likewise are proportional to the main channel (L+R) signal. Thus, current $I_2$, which is proportional to the main channel (L+R) signal is summed with the currents flowing through transistors $T_{r7}$ and $T_{r9}$, the latter currents being proportional to the sub-channel (L−R) signal. Hence, the signal which is applied to demodulator circuit output terminal 3L can be expressed as:

$$(R+L)+(L-R)=2L$$

Similarly, current $I'_2$, which is proportional to the main channel (R+L) signal is summed with the currents flowing through transistors $T_{r8}$ and $T_{r10}$, the latter currents being proportional to the oppositely phased sub-channel (R−L) signal. Hence, the signal supplied to demodulator circuit output terminal 3R can be expressed as:

$$(R+L)+(R-L)=2R.$$

Although not shown in FIG. 16, low pass filter circuitry may be coupled to output terminals 3L and 3R in order to attenuate, or remove higher frequency components, such as the 38 kHz subcarrier or the 38 kHz switching signal component. Thus, even if current $I_1$ flowing through transistor device $Q_1$ includes a component proportional to the sub-channel (L−R) signal which is modulated onto the 38 kHz subcarrier, this component, if present in currents $I_2$ and $I'_2$ will, nevertheless, be removed by this low pass filter.

In a modification of the illustrated embodiment, the output of amplifier 7 may be coupled to transistor device $Q_1$ of current mirror circuit 23 via a low pass coupling circuit. Such a circuit would block the sub-channel (L−R) signal component which is modulated onto the subcarrier and which is amplified by amplifier 7 from being present in current $I_1$ (and also currents $I_2$ and $I'_2$).

An equivalent circuit of amplifier 6, multiplier 10 and current mirror circuit 23 is shown in FIG. 17. More particularly, in this equivalent circuit, the switching circuit formed of differential amplifiers 6 and 8, and which demodulates the sub-channel (L−R) signal from its subcarrier is represented by current source 28. Similarly, the switching circuit formed of differential amplifiers 6 and 9, which produces the oppositely phased sub-channel (R−L) signal is represented by current source 27. Transistor devices $Q_2$ and $Q'_2$ of current mirror circuit 23 are represented as current sources 26 and 25, respectively. These latter current sources are variable, as indicated, because as described previously, the level of the currents $I_2$ and $I'$ which are proportional to the main channel (R+L) signal is adjustable by a corresponding adjustment of variable resistor 5 (FIG. 16).

Current source 27 (corresponding to the switching circuit formed of differential amplifiers 6 and 9) is coupled to voltage supply $E_3$ via load resistor 21 which, in FIG. 17, is designated as load resistor $R_L$. Similarly, current source 28 (corresponding to the switching circuit formed of differential amplifiers 6 and 8) is coupled to voltage source $E_3$ via load resistor 20 which, in FIG. 17, is represented as load resistor $R_L$. Thus, the resistance value of resistors 20 and 21 are, preferably, equal.

As easily seen from FIG. 17, the currents produced by current sources 26 and 28 are summed, resulting in the left channel (L) audio signal which is supplied to demodulator circuit output terminal 3L. Similarly, the currents produced by current sources 25 and 27 are summed, resulting in the right channel (R) audio signal which is supplied to output terminal 3R of the demodulator circuit. In order to provide good separation between the right and left channel audio signals, it is appreciated that the current proportional to the right channel component produced by current source 26 should be equal to the current proportional to the right channel component produced by current source 28. Likewise, the current proportional to the left channel component produced by current source 25 should be equal to the current porportional to the left channel component produced by current source 27. This is achieved by adjusting variable resistor 5 which, in turn, adjusts the levels of the currents produced by current sources 25 and 26. Consequently, suitable adjustment of variable resistor 5 results in good channel separation characteristics. That is, a left channel crosstalk component will be suppressed from the right channel audio signal and, conversely, a right channel crosstalk component will be suppressed from the left channel audio signal.

As mentioned previously, resistors 16 and 18 (and also resistors 15 and 17) have the same resistance value. Hence, the DC levels of the effective base electrodes of transistor devices $T_{r2}$ and $T_{r5}$ are equal. This means that direct current does not flow between these effective base electrodes via resistors 5 and 19. Consequently, even if variable resistor 5 is adjusted for the purpose of providing audio channel separation, this does not impart a corresponding change in the DC level of the demodulated audio signals supplied to demodulator circuit output terminals 3R and 3L.

When the illustrated stereo demodulator circuit is used with the current mirror circuit of the present invention, noise or hum which may be superimposed onto the operating voltage +B due to, for example, the power supply circuit used with this apparatus, or due to the AC mains, are prevented from being mixed with the demodulated audio outut signals. Furthermore, the stereo demodulator circuit can have a desirably wide dynamic range and high gain. Another advantage achieved by using the apparatus illustrated in FIG. 16 is that all of the illustrated circuitry can be fabricated as an integrated circuit except for variable resistor 5. A terminal P can be provided with this integrated circuit to which a suitable variable resistor can be connected.

While the present invention has been particularly shown and described with respect to various preferred embodiments thereof, and in conjunction for use with one type of apparatus, it should be readily apparent that various changes and modifications in form and details can be made without departing from the spirit and scope of the invention. For example, the Darlington-type configurations need not be limited solely to two transistors. Rather, additional transistors can be connected in such configuration. Also, the overall operating characteristics of the respective transistor devices used with the current mirror circuit may, if desired, resemble those of an NPN transistor. Corresponding changes in operating voltage values and resistive connections can be made consistent with such NPN-type transistor characteristics. Furthermore, various other uses and applications of the current mirror circuit disclosed herein are contemplated. Thus, this current mirror circuit need not be limited for use solely with a stereo demodulator circuit, such as the type shown and described with respect to FIG. 16. Therefore, it is intended that the appended claims be interpreted so as to include the foregoing as well as other such changes and modifications.

What is claimed is:

1. A current mirror circuit comprising a first transistor device having an input terminal and first and second output terminals, said first transistor device being formed of at least a pair of complementary transistors connected in Darlington-type configuration; a second transistor device having an input terminal and first and second output terminals, said second transistor device being formed of at least a pair of complementary transistors connected in Darlington-type configuration and having the input terminal thereof connected to said input terminal of said first transistor device; a third transistor device having an input terminal and first and second output terminals, said third transistor device being formed of at least a pair of transistors connected in Darlington-type configuration and having one of the output terminals thereof coupled to the input terminals of said first and second transistor devices; a first current output terminal coupled to one of the output terminals of said first transistor device; and a second current output terminal coupled to one of the output terminals of said second transistor device; and wherein the other output terminal of each of said first and second transistor devices is adapted to receive an operating voltage, said input terminal of said third transistor device is coupled to said first current output terminal, and the other output terminal of said third transistor device is coupled to a reference potential.

2. The current mirror circuit of claim 1 wherein said complementary transistors are NPN and PNP transistors, one of which being a lateral transistor and the other being a vertical transistor.

3. The current mirror circuit of claim 2 wherein said PNP transistor is the lateral transistor.

4. The current mirror circuit of claim 1 wherein said first and second transistor devices exhibit PNP-type operating characteristics.

5. The current mirror circuit of claim 4 wherein the pair of transistors comprising said third transistor device are both PNP-type transistors.

6. The current mirror circuit of claim 1 wherein the pair of transistors comprising at least said third transistor device are transistors of the same type.

7. The current mirror circuit of claim 4 further comprising a respective current feedback resistance means coupled between said other output terminal of each of said first and second transistor devices and a source of said operating voltage.

8. The current mirror circuit of claim 2 wherein the collector electrode of said PNP transistor is connected to the base electrode of said NPN transistor and the emitter electrode of said PNP transistor is connected to the collector electrode of said NPN transistor; and further comprising a respective base resistance means connected between the base and emitter electrodes of said NPN transistor.

9. The current mirror circuit of claim 7 further comprising at least one additional transistor device having an input terminal and first and second output terminals, each said additional transistor device being formed of at least a pair of transistors connected in Darlington-type configuration and having the input terminal thereof connected to said input terminals of said first and second transistor devices, a respective additional current output terminal coupled to one of the output terminals of each said additional transistor device, the other output terminal of each said additional transistor device being coupled through a respective current feedback resistance means to said source of operating voltage.

10. The current mirror circuit of claim 9 wherein said current feedback resistance means coupled to said second and to said each additional transistor device comprises a respective resistor connected to said other output terminal and a common resistor having one end connected in common to all of said respective resistors and another end to which an operating voltage is applied.

11. The current mirror circuit of claim 9 further comprising a resistance means connected between the said one output terminal of each said first, second and additional transistor devices and said first, second and additional current output terminals, respectively.

12. The current mirror circuit of claim 1 further comprising first and second resistors connected between the said one output terminal of said first and second transistor devices and said first and second current output terminals, respectively.

13. The current mirror circuit of claim 1 further comprising an additional resistor for coupling said one output terminal of said third transistor device to said input terminals of said first and second transistor devices.

14. A transistor circuit comprising:
a first transistor device having an input terminal and first and second output terminals, said first transistor device being formed of a pair of complementary transistors connected in Darlington-type configuration wherein the base electrode of one transistor is connected to said input terminal, the emitter electrode of said one transistor is connected to the collector electrode of the other transistor and also to said first output terminal, the collector electrode of said one transistor is connected to the base electrode of said other transistor, and the emitter electrode of said other transistor is connected to said second output terminal;
a second transistor device having an input terminal and first and second output terminals, said second transistor device being formed of a pair of complementary transistors connected in Darlington-type configuration wherein the base electrode of one transistor is connected to said input terminal, the emitter electrode of said one transistor is connected to the collector electrode of the other transistor and also to said first output terminal, the collector electrode of said one transistor is connected to the base electrode of said other transistor, and the emitter electrode of said other transistor is connected to said second output terminal, the base electrode of said one transistor in said second transistor device being connected to the base electrode of said one transistor in said first transistor device;
a third transistor device having an input terminal and first and second output terminals, said third transistor device being formed of at least a pair of transistors connected in Darlington-type configuration and having one of the output terminals thereof coupled to the connected base electrodes of said one transistor in each said first and second transistor devices;
a first current output terminal coupled to the emitter electrode of said other transistor in said first transistor device;
a second current output terminal coupled to the emitter electrode of said other transistor in said second transistor device;
and wherein the connected emitter and collector electrodes in each transistor device are adapted to receive an operating voltage, said input terminal of said third transistor device is coupled to said first current output terminal, and the other output terminal of said third transistor device is coupled to a reference potential.

15. The transistor circuit of claim 14 wherein said pair of transistors comprising said third transistor device are of the same conductivity type for applying a bias voltage between the base electrode of said one transistor and the emitter electrode of said other transistor in said first transistor device which is greater than base-emitter voltage of said last-mentioned other transistor.

16. The transistor circuit of claim 14 further comprising a respective base resistor connected between the base electrode of said other transistor and the current output terminal in each of said first and second transistor devices.

17. The transistor circuit of claim 16 further comprising:
a fourth transistor device having an input terminal and first and second output terminals, said fourth transistor device being formed of a pair of complementary transistors connected in Darlington-type configuration wherein the base electrode of one transistor is connected to said input terminal, the emitter electrode of said one transistor is connected to the collector electrode of the other transistor and also to said first output terminal, the collector electrode of said one transistor is connected to the base electrode of said other transistor and the emitter electrode of said other transistor is connected to said second output terminal, the base electrode of said one transistor in said fourth transistor device being connected to the base electrode of said one transistor in said first transistor device, the connected emitter and collector electrodes in said fourth transistor device being adapted to receive an operating voltage, and a third current output terminal being coupled to the emitter electrode of said other transistor in said fourth transistor device;
an amplifier coupled to said first current output terminal for determining the current flowing through said first transistor device to said first current output terminal; and
switching means coupled to said second and third current output terminals for providing respective signals thereat to which are added currents supplied by said second and fourth transistor devices, which currents are substantially equal to said current flowing to said first current output terminal.

18. The transistor circuit of claim 17 wherein said amplifier comprises a first amplifier for receiving a composite stereo signal comprised of a main channel (L+R) signal and a subchannel (L−R) signal modulated onto a subcarrier, said first amplifier having an output coupled to said first current output terminal; and wherein said switching means comprises a second amplifier for receiving said composite stereo signal, said second amplifier having first and second outputs, and a multiplier circuit coupled to the first and second outputs of said second amplifier and receiving a switching signal having a frequency substantially equal to the frequency of said subcarrier, said multiplier circuit having a first output for producing a sub-channel (L−R) signal and a second output for producing an oppositely phased sub-channel (R−L) signal, the first output of said multiplier circuit being coupled to said second current output terminal and the second output of said multiplier circuit being coupled to said third current output terminal; whereby the current flowing through said first transistor device to said first current output terminal includes a component proportional to said main channel (L+R) signal, and the currents flowing through said second and fourth transistor devices to said second and third current output terminals each include a component proportional to said main channel (L+R) signal, which component is added to the respective sub-channel signals produced by said multiplier circuit.

19. A transistor circuit, comprising:
a first transistor device having an input terminal and first and second output terminals, said first transistor device being formed of a pair of complementary transistors connected in Darlington-type configuration;
a second transistor device having an input terminal and first and second output terminals, said second transistor device being formed of a pair of complementary transistors connected in Darlington-type configuration and having the input terminal thereof connected to said input terminal of said first transistor device;
a third transistor device having an input terminal and first and second output terminals, said third transistor device being formed of a pair of transistors connected in Darlington-type configuration and having one of the output terminals thereof coupled to the input terminal of said first transistor device;
a fourth transistor device having an input terminal and first and second output terminals, said fourth transistor device being formed of a pair of transistors connected in Darlington-type configuration and having the input terminal thereof connected to said input terminal of said first transistor device;
first, second and third current output terminals coupled to one of the output terminals of said first, second and fourth transistor devices, respectively, the other output terminals of said first, second and fourth transistor devices being adapted to receive an operating voltage;
the input terminal of said third transistor device being coupled to said first current output terminal and the other output terminal of said third transistor device being coupled to a reference potential;
a first amplifier for receiving a composite stereo signal comprised of a main channel (L+R) signal and a sub-channel (L−R) signal modulated onto a subcarrier, said first amplifier having an output coupled to said first current output terminal for establishing the current flowing through said first transistor device to have a component proportional to said main channel (L+R) signal;
a second amplifier for receiving said composite stereo signal and having first and second outputs;
multiplier means coupled to the first and second outputs of said second amplifier, said multiplier means receiving a switching signal having a frequency substantially equal to the frequency of said subcarrier, said multiplier means having first and second outputs coupled to said second and third current output terminals, respectively, whereby said multiplier means produce said sub-channel (L−R) signal and an oppositely phased sub-channel (R−L) signal, respectively, at said first and second outputs thereof; and
first and second output terminals coupled to said first and second outputs of said multiplier means for receiving the summation of said sub-channel (L−R) signal and said current flowing in said second transistor device and the summation of said oppositely phased sub-channel (R−L) signal and said current flowing in said fourth transistor device, respectively.

20. The transistor circuit of claim 19 wherein said first amplifier includes means for adjusting the level of said composite stereo signal applied thereto for correspondingly adjusting the levels of the currents flowing through said second and fourth transistor devices and summed with said sub-channel (L−R) signal and oppositely phased sub-channel (R−L) signal, respectively.

21. The transistor circuit of claim 19 wherein said first and second amplifiers each comprise a differential amplifier formed of differentially-connected stages; and said multiplier means comprises third and fourth differential amplifiers each formed of differentially-connected transistors, the transistors included in said third differential amplifier having their emitter electrodes connected in common to one output of said second differential amplifier and the transistors included in said fourth differential amplifier having their emitter electrodes connected in common to the other output of said second differential amplifier, the collector electrode of one of the differentially-connected transistors in said third differential amplifier being connected in common with the collector electrode of one of the differentially-connected transistors in said fourth differential amplifier to said second current output terminal, and the collector electrode of the other differentially-connected transistor in said third differential amplifier being connected in common with the collector electrode of the other differentially-connected transistor in said fourth differential amplifier to said third current output terminal.

* * * * *